(12) United States Patent
Lee et al.

(10) Patent No.: US 10,211,093 B2
(45) Date of Patent: Feb. 19, 2019

(54) INTERCONNECT STRUCTURE FORMED WITH A HIGH ASPECT RATIO SINGLE DAMASCENE COPPER LINE ON A NON-DAMASCENE VIA

(71) Applicant: Samsung Electronics Co., Ltd., Suwon-si, Gyeonggi-do (KR)

(72) Inventors: Ki-Don Lee, Austin, TX (US); Daniel Sawyer, Pflugerville, TX (US); Steven English, Cedar Park, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/261,644

(22) Filed: Sep. 9, 2016

(65) Prior Publication Data

US 2018/0012796 A1 Jan. 11, 2018

Related U.S. Application Data

(60) Provisional application No. 62/360,305, filed on Jul. 8, 2016.

(51) Int. Cl.
*H01L 23/48* (2006.01)
*H01L 23/52* (2006.01)
(Continued)

(52) U.S. Cl.
CPC .. *H01L 21/76834* (2013.01); *H01L 21/76885* (2013.01); *H01L 23/5226* (2013.01); *H01L 23/5283* (2013.01); *H01L 23/53228* (2013.01); *H01L 23/53257* (2013.01); *H01L 23/53295* (2013.01); *H01L 23/5329* (2013.01); *H01L 23/53209* (2013.01); *H01L 23/53238* (2013.01); *H01L 23/53266* (2013.01)

(58) Field of Classification Search
CPC ......... H01L 21/76807; H01L 21/76802; H01L 23/5226; H01L 23/53238
USPC ................................. 257/758, 751, 750, 774
See application file for complete search history.

(56) References Cited

U.S. PATENT DOCUMENTS 6,294,457 B1 * 9/2001 Liu .................... H01L 21/76802
257/E21.577
6,710,425 B2 * 3/2004 Bothra .................... H01L 28/40
257/295
(Continued)

*Primary Examiner* — S. V. Clark
(74) *Attorney, Agent, or Firm* — Renaissance IP Law Group LLP

(57) ABSTRACT

An interconnect structure and a method to form an interconnect structure utilizes a high-aspect ratio single-damascene line and a non-damascene via. The interconnect includes a first single-damascene interconnect line disposed in a first interlayer dielectric layer, and a non-damascene via on the first single-damascene interconnect line that may be formed from cobalt, titanium and/or tungsten. A first SiCN layer may be formed on one or more sidewalls of the non-damascene via. A second single-damascene layer may be formed on the non-damascene via in which the second single-damascene layer may be disposed in a second interlayer dielectric layer. A second SiCN layer may be formed on at least part of an upper surface of the first single-damascene layer, and a third SiCN layer may be formed on at least part of an upper surface of the second single-damascene layer.

12 Claims, 5 Drawing Sheets

(51) Int. Cl.
*H01L 29/40* (2006.01)
*H01L 21/768* (2006.01)
*H01L 23/522* (2006.01)
*H01L 23/528* (2006.01)
*H01L 23/532* (2006.01)

(56) References Cited

U.S. PATENT DOCUMENTS

2009/0108369 A1* 4/2009 Chu .................... H01L 23/5225
 257/369
2012/0313256 A1* 12/2012 Lu ..................... H01L 21/31144
 257/774
2016/0099211 A1* 4/2016 Baek .................... H01L 27/088
 257/774
2016/0190042 A1* 6/2016 Jindal ................... H01L 23/481
 257/741
2016/0225665 A1 8/2016 Yoo et al.

* cited by examiner

INTERCONNECT STRUCTURE FORMED WITH A HIGH ASPECT RATIO SINGLE DAMASCENE COPPER LINE ON A NON-DAMASCENE VIA

CROSS-REFERENCE TO RELATED APPLICATION

This patent application claims the priority benefit under 35 U.S.C. § 119(e) of U.S. Provisional Patent Application No. 62/360,305, filed on Jul. 8, 2016, the disclosure of which is incorporated herein by reference in its entirety.

BACKGROUND

As integrated-circuit devices scale smaller, higher-resistance metals, such as cobalt, are being used as vias to connect copper interconnects. The higher-resistance metals, however, increase the overall resistance of an interconnect structure, thereby adversely impacting the performance (i.e., the RC delay) and the reliability of the integrated device. The resistance of conventional dual-damascene copper via especially increases rapidly with device scaling and may exceed the resistivity of a pure cobalt via. In this case, cobalt may be considered as a via material.

SUMMARY

An example embodiment provides an interconnect structure that may include a first single-damascene interconnect line in which the first single-damascene layer may be disposed in a first interlayer dielectric layer; and a non-damascene via on the first single-damascene interconnect line. A second single-damascene layer may be formed on the non-damascene via in which the second single-damascene layer may be disposed in a second interlayer dielectric layer. The first single-damascene interconnect line may include a first encapsulation layer on at least sidewall surfaces and a bottom surface of the first single-damascene interconnect in which the first encapsulation layer may include tantalum, tantalum nitride and/or cobalt. The second single-damascene interconnect line may include a second encapsulation layer on at least sidewall surfaces and a bottom surface of the second single-damascene interconnect, and the second encapsulation layer may include tantalum, tantalum nitride and/or cobalt. The non-damascene via may include cobalt, titanium and/or tungsten. A SiCN layer may be formed on one or more sidewalls of the non-damascene via.

An example embodiment provides an interconnect structure that may include a first single-damascene interconnect line in which the first single-damascene layer may be disposed in a first interlayer dielectric layer; a non-damascene via on the first single-damascene interconnect line in which the non-damascene via may include cobalt, titanium and/or tungsten; a first SiCN layer on one or more sidewalls of the non-damascene via; and a second single-damascene layer on the non-damascene via in which the second single-damascene layer may be disposed in a second interlay dielectric layer. A second SiCN layer may be formed on at least part of an upper surface of the first single-damascene layer, and a third SiCN layer may be formed on at least part of an upper surface of the second single-damascene layer. A first encapsulation layer may be formed on at least sidewall surfaces and a bottom surface of the first single-damascene interconnect in which the first encapsulation layer may include tantalum, tantalum nitride and/or cobalt. A second encapsulation layer may be formed on at least sidewall surfaces and a bottom surface of the second single-damascene interconnect in which the second encapsulation layer may include tantalum, tantalum nitride and/or cobalt. At least one of the first single-damascene interconnect line and the second single-damascene line includes copper.

An example embodiment provides a method to form an interconnect structure that may include forming a first single-damascene interconnect line disposed in a first interlayer dielectric layer; and forming a non-damascene via on the first single-damascene interconnect line. Forming the non-damascene via may include forming a layer of metal on the first single-damascene interconnect line in which the layer of metal may include tantalum, tantalum nitride and/or cobalt; and patterning the layer of metal to form the non-damascene via. A second single-damascene layer may be formed on the non-damascene via. A SiCN layer may be formed on at least one sidewall of the non-damascene via. An encapsulation layer may be formed on at least sidewall surfaces and a bottom surface of at least one of the first single-damascene interconnect and the second single-damascene interconnect in which each encapsulation layer may include tantalum, tantalum nitride and/or cobalt.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
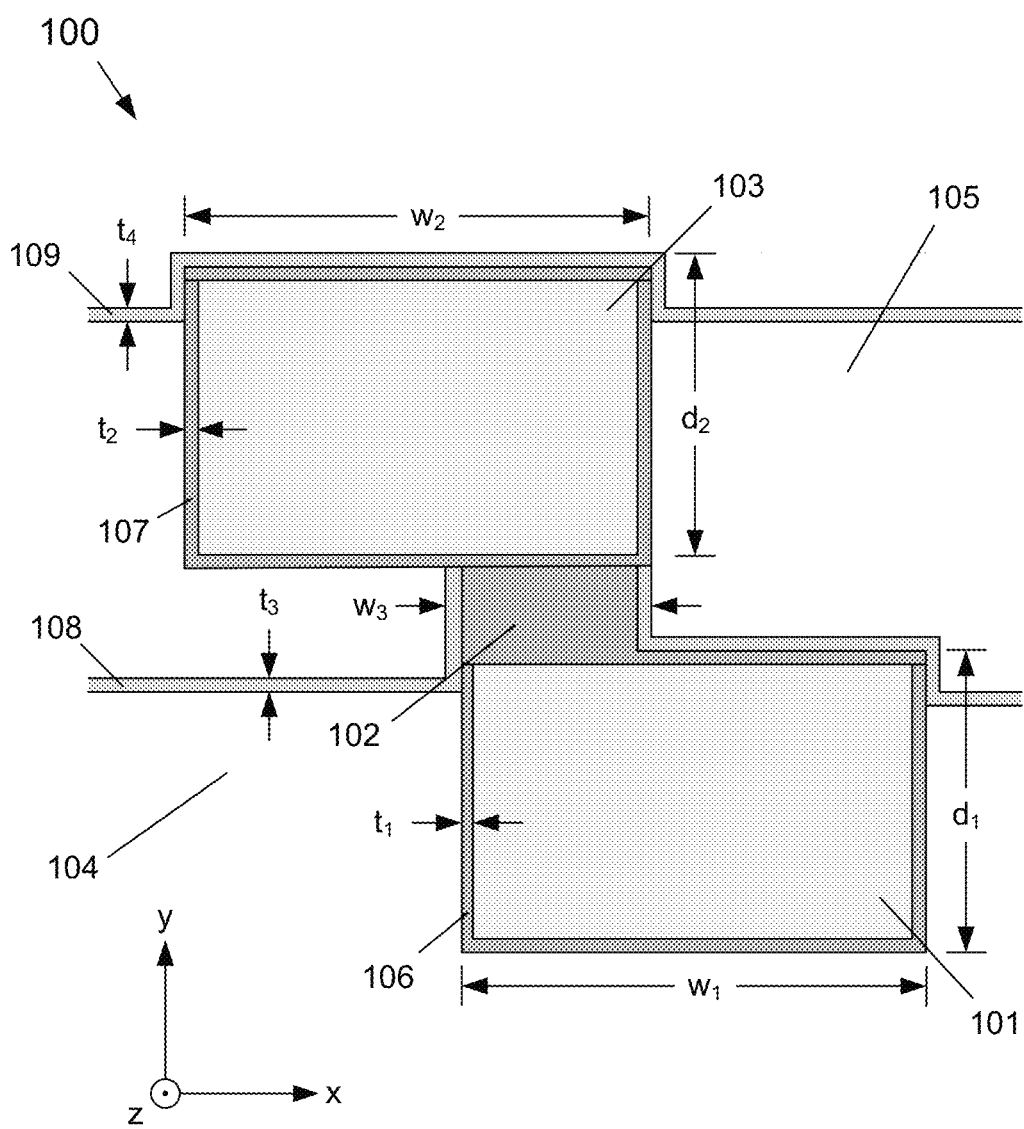
FIG. 1 depicts a cross-sectional view of an example embodiment of an interconnect structure according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides an interconnect structure that may include a high-aspect ratio single-damascene line and a non-damascene via. Additionally, the subject matter disclosed herein provides an interconnect structure that may include a high-aspect ratio single-damascene copper line surrounded by a cobalt barrier layer, and a non-damascene metal via formed by etching, for example, cobalt, titanium and/or tungsten. In one embodiment, the non-damascene metal view may include SiCN on sidewalls of the via for high reliability performance. In one embodiment, the interconnect structure provided herein is suitable for technology nodes of 10 nm or less.

According to the subject matter disclosed herein, an interconnect structure may include a via that is formed using a non-damascene process and a single-damascene interconnect line having a trench depth that is twice as deep (i.e., larger cross-sectional area) as a conventional single-damascene interconnect to reduce interconnect line resistance by, for example, a factor of about two (2). In one embodiment, a single-damascene process may damage a low-k interlayer dielectric layer less than a dual-damascene process. In one embodiment, a high-aspect ratio single-damascene interconnect may be formed from a low-resistance material, such as, but not limited to, copper, to improve interconnect performance by providing a low RC delay along the interconnect. In one embodiment, a single-damascene copper interconnect may be formed to have the same depth as a conventional dual-damascene interconnect.

FIG. 1 depicts a cross-sectional view of an example embodiment of an interconnect structure 100 according to the subject matter disclosed herein. In one embodiment, the interconnect structure 100 includes a high-aspect ratio single-damascene copper line with a non-damascene via. The interconnect structure 100 may include a first interconnect line 101, a via 102 and a second interconnect line 103. As depicted in FIG. 1, the first and second interconnect lines 101 and 103 extend into FIG. 1 (i.e., along the z-axis) at the location of the cross-sectional view. It should be understood that at other locations that are different from the location of the cross-sectional view, each of the first and second interconnect lines 101 and 103 may or may not extend in a direction that is along the x-axis, along the z-axis and/or in a direction that may be along a combination of the x- and z-axes.

The first interconnect line 101 may be formed in a first interlayer dielectric layer 104 by a single-damascene process using, for example, copper, as a conductive material. The via 102 may be formed using a non-damascene process and be formed from a conductive material, such as a metal, that has a resistance that is greater than copper. The second interconnect line 103 may be formed in a second interlayer dielectric layer 105 by a single-damascene process using, for example, copper, as a conductive material. The first and second interlayer dielectric layers 104 and 105 may be formed from a low-k dielectric material, such as, but not limited to, SiCOH, porous carbon-doped silicon dioxide.

The first interconnect line 101 may have a width $w_1$ that extends in a direction that is substantially parallel to a plane formed by the x- and z-axes, and may have a depth $d_1$ that extends in a direction that is substantially parallel to the y-axis. The second interconnect line 103 may have a width $w_2$ that extends in a direction that is substantially parallel to the plane formed by the x- and z-axes, and may have a depth $d_2$ that extends in a direction that is substantially parallel to the y-axis. The width $w_1$ and the depth $d_1$ of the first interconnect line 101 and the width $w_2$ and the depth $d_2$ of the second interconnect line 103 may be selectively scaled as integrated-circuit devices scale smaller. In one embodiment, the widths $w_1$ and $w_2$ and the depths $d_1$ and $d_2$ may be selected so that the cross-sectional areas of the interconnect lines 101 and 103 provides a resistance per unit length of the interconnect line that in combination with the resistance provided by the non-damascene via is suitable for the interconnect line. In one embodiment, the depth $d_1$ of the first interconnect line 101 may be about 64 nm. In one embodiment, the depth $d_2$ of the second interconnect line 103 may be about 64 nm. In one embodiment, the depth $d_1$ and the depth $d_2$ may both be about 64 nm. In one embodiment, the depth $d_1$ and/or the depth $d_2$ may be greater than or less than about 64 nm.

A barrier layer 106 may be formed to surround at least the side and bottom surfaces of the first interconnect line 101. The barrier layer 106 may be formed from a conductive material, such as a metal. In one embodiment, the barrier layer 106 may be formed from tantalum, tantalum nitride and/or cobalt using a well-known PVD, CVS and/or ALD process. In one embodiment, the barrier layer 106 may be formed from the same material or materials used to form the via 102. The barrier layer 106 may have a thickness $t_1$ that ranges from about 1 nm to about 10 nm. Although the thickness $t_1$ is depicted in FIG. 1 as being associated with a side or a sidewall of the first interconnect line 101, it should be understood that the thickness $t_1$ may refer to a nominal thickness of the barrier layer 106 on any side of the first interconnect line 101.

A barrier layer 107 may be formed to surround at least the side and bottom surfaces of the second interconnect line 103. The barrier layer 107 may be formed from a conductive material, such as a metal. In one embodiment, the barrier layer 107 may be formed from tantalum, tantalum nitride and/or cobalt using a well-known PVD, CVS and/or ALD process. In one embodiment, the barrier layer 107 may be formed from the same material or materials used to form the via 102. The barrier layer 107 may have a thickness $t_2$ that ranges from about 1 nm to about 10 nm. Although the thickness $t_2$ is depicted in FIG. 1 as being associated with a side or a sidewall of the second interconnect line 103, it should be understood that the thickness $t_2$ may refer to a nominal thickness of the barrier layer 107 on any side of the second interconnect line 103.

The via 102 extends in a direction that is substantially parallel to the y-axis between the first interconnect line 101 and the second interconnect line 103. In one embodiment, the via 102 may be formed from a metal, such as, but not limited to cobalt, titanium and/or tungsten. In one embodiment, the melting temperature of the metal forming the via 102 may be higher than the melting temperature of copper to thereby improve the reliability of the via 102 and to improve the current design margin of the via 102. In one embodiment, a TiN layer (not shown) and/or a Ti layer (not shown) may be formed on the first interconnect line 101 to provide better adhesion of the via 102 to the first interconnect line 101, and/or to provide better patterning of the via 102. In one embodiment, a TiN layer (not shown) and/or a Ti layer (not shown) may be formed on the top surface of the via 102 to provide better adhesion of the second interconnect line 103 to the via 102.

In one embodiment, the via 102 may have a width $w_3$ that is measured in a direction that is substantially parallel to a plane form by the x- and z-axes. In embodiment, width $w_3$ may be about 32 nm. In another embodiment, the via 102 may have a width $w_3$ that is different from about 32 nm. In one embodiment, the via 102 may have a generally circularly shaped cross-sectional area as viewed in a plan view. In another embodiment, the via 102 may have a cross-sectional shape that is different from being generally circular as viewed in a plan view. In one embodiment, the width $w_3$ may include the thickness $t_3$ of a barrier layer 108, which is described below.

A third barrier layer 108 may be formed on sidewalls of the via 102 and a top surface of the first interconnect line 101. The barrier layer 108 may be formed from, for example, SiCN. In one embodiment, the barrier layer 108 may have a thickness $t_3$ that ranges from about 1 nm to about 10 nm. A fourth barrier layer 109 may be formed on a top surface of the second interconnect line 103. The barrier layer 109 may be formed from, for example, SiCN. In one embodiment, the barrier layer 109 may have a thickness $t_4$ that ranges from about 1 nm to about 10 nm. Although the thicknesses $t_3$ and $t_4$ are respectively depicted in FIG. 1 as being associated with a specific location of barrier layers 108 and 109, it should be understood that the thicknesses $t_3$ and $t_4$ may refer to a nominal thickness of the corresponding barrier layer 108 and 109.

Figure 2:
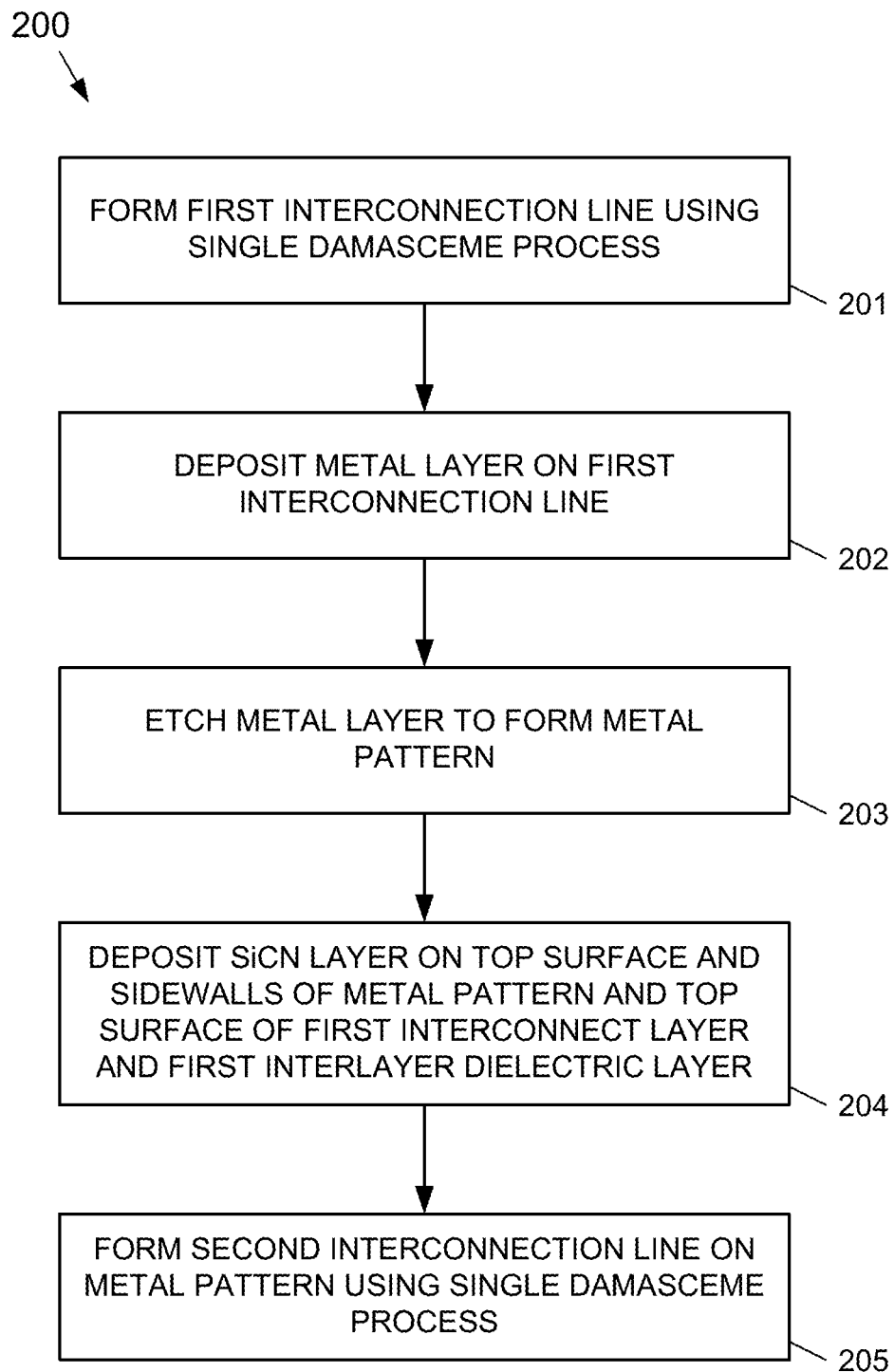
FIG. 2 depicts a flow diagram of an example method to form the example embodiment of an interconnect structure that includes a high-aspect ratio single-damascene copper line with a non-damascene via according to the subject matter disclosed herein.

FIG. 2 depicts a flow diagram of an example method 200 to form the example embodiment of an interconnect structure that includes a high-aspect ratio single-damascene copper line with a non-damascene via according to the subject matter disclosed herein. FIGS. 3A-3E respectively depict cross-sectional view at selected stages during formation of an example embodiment of interconnect structure 300 according to the subject matter disclosed herein. As depicted in FIGS. 3A-3E, the interconnect lines of the interconnect structure 300 extend into the figures (i.e., along the z-axis) at the location of the cross-sectional view. It should be understood that at other locations that are different from the location of the cross-sectional view each of the interconnect lines of the interconnect structure 300 may or may not extend in a direction that is along the x-axis, along the z-axis and/or in a direction that may be along a combination of the x- and z-axes.

Figure 3A:
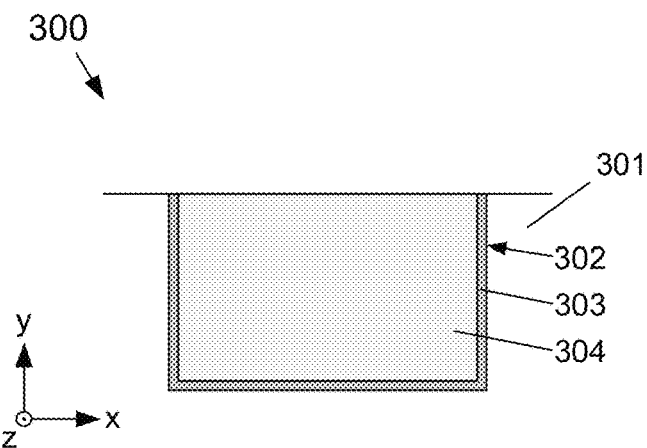
FIGS. 3A-3E respectively depict cross-sectional view at selected stages during formation of an example embodiment of interconnect structure according to the subject matter disclosed herein.

At 201 in FIG. 2, a first interlayer dielectric layer 301 may be formed using a well-known technique. The first interlayer dielectric layer 301 may be formed from a low-k dielectric material, such as, but not limited to, SiCOH, porous carbon-doped silicon dioxide. A trench 302 is formed in a well-known manner in the first interlayer dielectric layer 301. A layer of metal 303 may be formed in the trench 302 to cover sidewalls and a bottom of the trench 302 using, for example, a well-known PVD, CVS and/or ALD technique. The layer of metal 303 may be formed from, for example, tantalum, tantalum nitride, and/or cobalt. A first interconnect line 304 may be formed in the trench 302 on the layer of metal 303 using a single-damascene process. The first interconnect line 304 may be formed from a conductive materials, such as, but not limited to, copper. FIG. 3A depicts a cross-sectional view of an interconnect structure 300 after the first interconnect line 304 has been filled by the single-damascene process. In one embodiment, the width and the depth of the first interconnect line 304 may be selected so that the cross-sectional areas of the interconnect line 304 provides a resistance per unit length of the interconnect line that in combination with the resistance provided by the non-damascene via (see via 102 in FIG. 1) is suitable for the interconnect line.

Figure 3B:
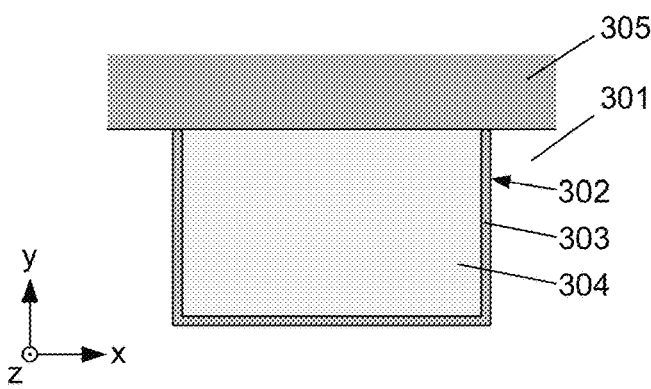

At 202 in FIG. 2, a layer of metal 305 is deposited on first interlayer dielectric layer 301 and the first interconnect line 304 using a well-known technique. The layer of metal 305 may be formed from, for example, cobalt, titanium and/or tungsten, and may be 30 nm thick. FIG. 3B depicts a cross-sectional view of the interconnect structure 300 after the layer of metal 305 has been deposited on the first interlayer dielectric layer 301 and the first interconnect line 304. In one embodiment, a TiN layer (not shown) may be formed on the first interconnect line 304 to provide better adhesion of a non-damascene via that will be formed to the first interconnect line 304, and/or to provide better patterning of the non-damascene via that will be formed.

Figure 3C:
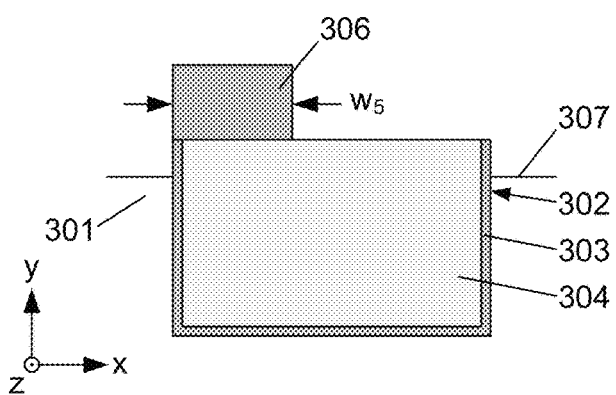

At 203 in FIG. 2, the layer of metal 305 is etched using a well-known technique to form a metal pattern 306. In one embodiment, a width $w_5$ may be equivalent to the width $w_3$ depicted in FIG. 1. In one embodiment, a width $w_5$ may be about that is about 32 nm. In another embodiment, the metal pattern 306 may have a width $w_5$ that is different from about 32 nm. In one embodiment, the metal pattern 306 has a generally circularly shaped cross-sectional area as viewed in a plan view. In another embodiment, the metal pattern 306 may have a cross-sectional shape that is different from being generally circular as viewed in a plan view. A layer of the metal material may be left on the top surface of the first interconnect line 304. During the etching process, a portion of a top surface of the first interlayer dielectric layer 301 may also be etched away, as depicted in FIG. 3C, so that a top surface 307 of the interlayer dielectric layer 301 may be lower than a top surface of the first single-damascene line 304. In one embodiment, a cobalt layer (not shown) may be formed on the top surface of the metal pattern 306 and top surface and sidewalls of the interconnect line 304 that are exposed for an electroless plating technique.

Figure 3D:
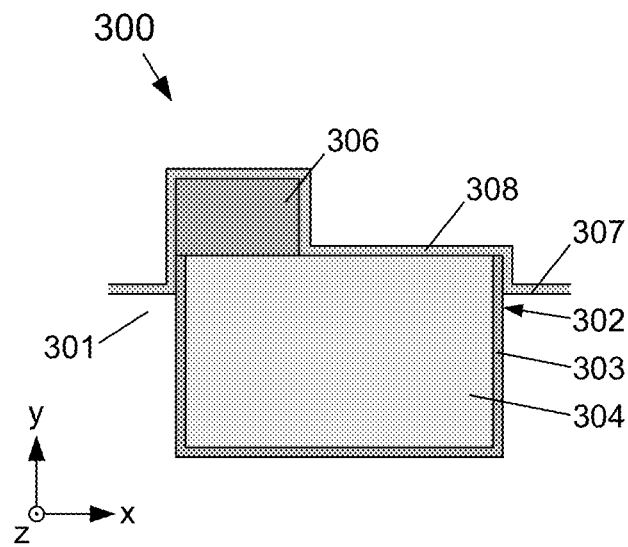

At 204 in FIG. 2, a SiCN layer 308 is deposited on the top surface and sidewalls of the metal pattern 306, the top surface of the filled first interconnect line 304, and the top surface 307 of the first interlayer dielectric layer 301. FIG. 3D depicts the interconnect structure 300 after the SiCN layer 308 has been deposited on the top surface of the metal pattern 306.

Figure 3E:
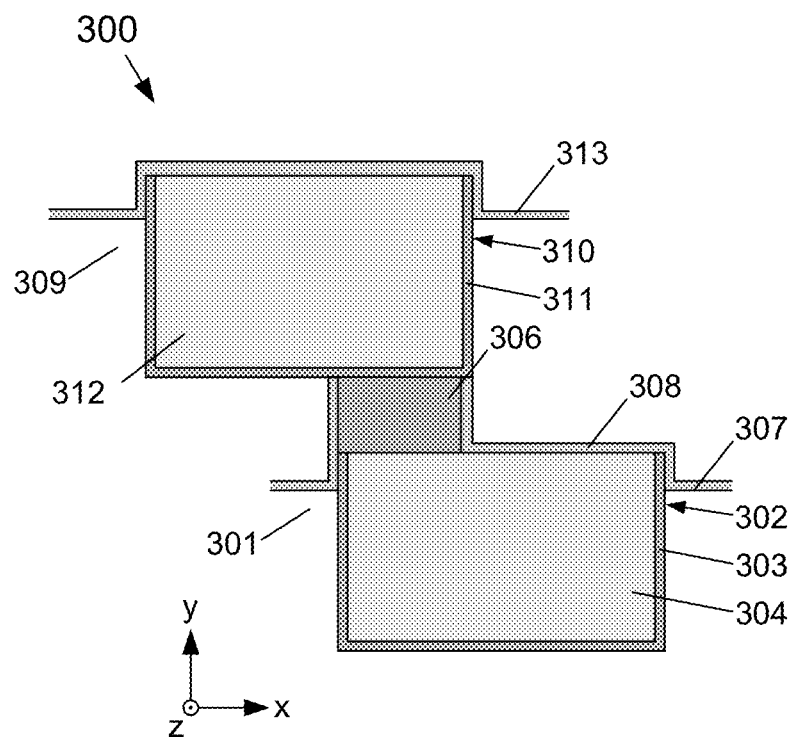

At 205 in FIG. 2, a second interlayer dielectric layer 309 is formed on the intermediate structure depicted in FIG. 3D. A trench 310 is formed in the second interlayer dielectric layer 309. During the formation of trench 310, the SiCN layer 308 is removed from the top surface of metal pattern 306. A layer of metal 311 may be formed in the trench to cover sidewalls and a bottom of the trench 310 using, for example, a well-known PVD, CVS and/or ALD process. The layer of metal 311 may be formed from, for example, tantalum, tantalum nitride, and/or cobalt. A second interconnect line 312 may be formed in the trench 309 on the layer of metal 311 using a single-damascene process. The second interconnect line 312 may be formed from a conductive materials, such as, but not limited to, copper. A second SiCN layer 313 is deposited on the second interconnect line 312. FIG. 3E depicts a cross-sectional view of the interconnect structure 300 after the second interconnect line 312 has been filled by the single-damascene process and covered by the second SiCN layer 313. In one embodiment, a cobalt layer (not shown) may be on the top surface of the interconnect line 312. In one embodiment, the width and the depth of the first interconnect line 312 may be selected so that the cross-sectional areas of the interconnect line 312 provides a resistance per unit length of the interconnect line that in combination with the resistance provided by the non-damascene via (see via 102 in FIG. 1) is suitable for the interconnect line. It should be understood that the interconnect lines 304 and 312 of the interconnect structure 300 may be vertically aligned (i.e., in the y-axis direction) differently than as depicted in the figures herein. Moreover, it should be understood that the interconnects as disclosed herein are not limited to two levels and can be more than two levels. In one embodiment, the interconnects as disclosed herein may be up to ten or more levels.

Figure 4:
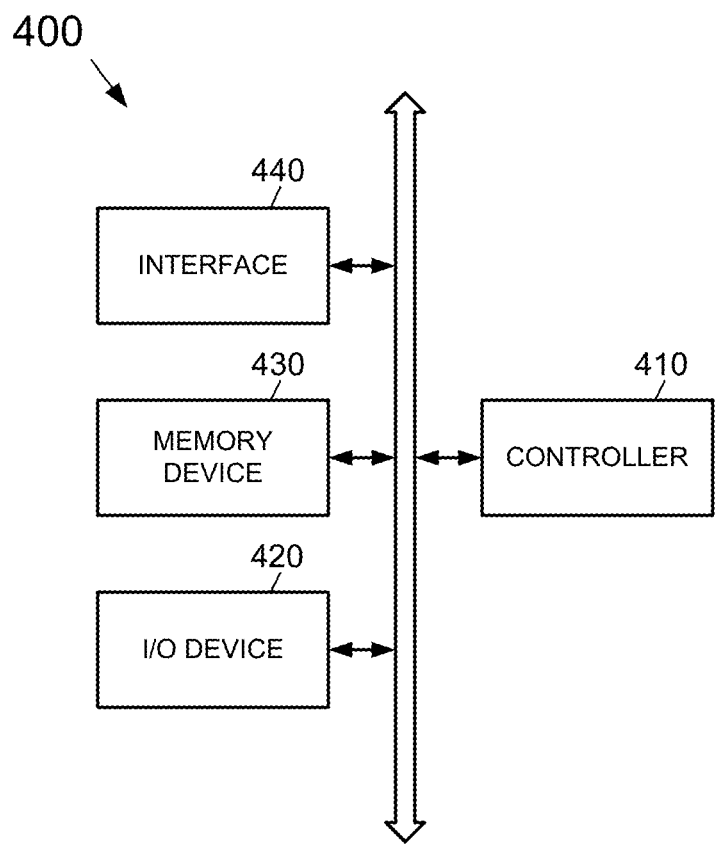
FIG. 4 depicts an electronic device that includes one or more integrated circuits (chips) that include an interconnect structure according to the subject matter disclosed herein.

FIG. 4 depicts an electronic device 400 that includes one or more integrated circuits (chips) that include an interconnect structure according to the subject matter disclosed herein. Electronic device 400 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 400 may include a controller 410, an input/output device 420 such as, but not limited to, a keypad, a keyboard, a display, or a touch-screen display, a memory 430, and a wireless interface 440 that are coupled to each other through a bus 450. The controller 410 may include, for example, at least one microprocessor, at least one digital signal process, at least one microcontroller, or the like. The memory 430 may be configured to store a command code to be used by the controller 410 or a user data. Electronic device 400 and the various system components including electronic device 400 may include an interconnect structure according to the subject matter disclosed herein. The electronic device 400 may use a wireless interface 440 configured to transmit data to or receive data from a wireless communication network using a RF signal. The wireless interface 440 may include, for example, an antenna, a wireless transceiver and so on. The electronic system 400 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multi-channel Multipoint Distribution Service (MMDS), and so forth.

Figure 5:
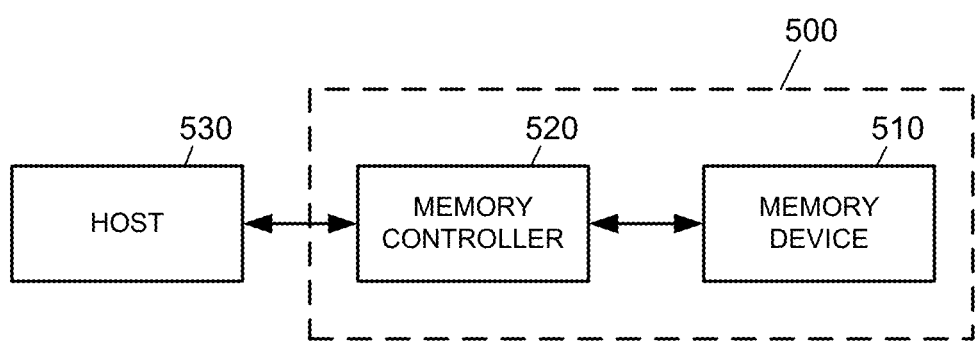
FIG. 5 depicts a memory system that may include an interconnect structure according to the subject matter disclosed herein.

FIG. 5 depicts a memory system 500 that may include an interconnect structure according to the subject matter disclosed herein. The memory system 500 may include a memory device 510 for storing large amounts of data and a memory controller 520. The memory controller 520 controls the memory device 510 to read data stored in the memory device 510 or to write data into the memory device 510 in response to a read/write request of a host 530. The memory controller 520 may include an address-mapping table for mapping an address provided from the host 530 (e.g., a mobile device or a computer system) into a physical address of the memory device 510. The memory device 510 may include one or more semiconductor devices that include an interconnect structure according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. An interconnect structure, comprising:
   a first single-damascene interconnect line, the first single-damascene interconnect line being disposed in a first interlayer dielectric layer;
   a non-damascene via on the first single-damascene interconnect line;
   a SiCN layer on one or more sidewalls of the non-damascene via,
   wherein a top surface of the first single-damascene interconnect line is higher than a top surface of the first interlayer dielectric layer.

2. The interconnect structure according to claim 1, further comprising:
   a second single-damascene interconnect line on the non-damascene via, the second single-damascene interconnect line being disposed in a second interlayer dielectric layer.

3. The interconnect structure according to claim 2, further comprises:
   a first barrier layer on at least sidewall surfaces and a bottom surface of the second single-damascene interconnect line, and
   wherein the first barrier layer comprises tantalum, tantalum nitride or cobalt.

4. The interconnect structure according to claim 2, further comprises:
   a second barrier layer on at least sidewall surfaces and a bottom surface of the first single-damascene interconnect line.

5. The interconnect structure according to claim 4,
   wherein the second barrier layer comprises tantalum, tantalum nitride or cobalt.

6. The interconnect structure according to claim 4,
   wherein the non-damascene via comprises cobalt, titanium or tungsten.

7. The interconnect structure according to claim 1,
   wherein the first single-damascene interconnect line comprises copper.

8. An interconnect structure, comprising:
   a first single-damascene interconnect line, the first single-damascene interconnect line being disposed in a first interlayer dielectric layer;
   a non-damascene via on the first single-damascene interconnect line, the non-damascene via comprising cobalt, titanium or tungsten;
   a first SiCN layer on one or more sidewalls of the non-damascene via; and
   a second single-damascene interconnect line on the non-damascene via, the second single-damascene interconnect line being disposed in a second interlayer dielectric layer.

9. The interconnect structure according to claim 8, further comprising:
   a second SiCN layer on at least part of an upper surface of the first single-damascene interconnect line, and
   a third SiCN layer on at least part of an upper surface of the second single-damascene interconnect line.

10. The interconnect structure according to claim 8, further comprising a first barrier layer on at least sidewall surfaces and a bottom surface of the first single-damascene interconnect line,
    wherein the first barrier layer comprises tantalum, tantalum nitride or cobalt.

11. The interconnect structure according to claim 8, further comprising a second barrier layer on at least sidewall surfaces and a bottom surface of the second single-damascene interconnect line,
    wherein the second barrier layer comprises tantalum, tantalum nitride or cobalt.

12. The interconnect structure according to claim 8,
    wherein at least one of the first single-damascene interconnect line and the second single-damascene interconnect line comprises copper.

* * * * *